United States Patent
Jayanthi et al.

(10) Patent No.: US 12,438,546 B1
(45) Date of Patent: Oct. 7, 2025

(54) DRIVER/INVERTER USING LOWER VOLTAGE TOLERANT DEVICES

(71) Applicant: Synopsys, Inc., Sunnyvale, CA (US)

(72) Inventors: Sri Ram Kumar Jayanthi, Andhra Pradesh (IN); Akhil Thotli, Andhra Pradesh (IN); Rahul Gupta, Haryana (IN)

(73) Assignee: SYNOPSYS, INC., Sunnyvale, CA (US)

( * ) Notice: Subject to any disclaimer, the term of this patent is extended or adjusted under 35 U.S.C. 154(b) by 241 days.

(21) Appl. No.: 18/209,203

(22) Filed: Jun. 13, 2023

(51) Int. Cl.
*H03K 19/0944* (2006.01)

(52) U.S. Cl.
CPC .................. *H03K 19/0944* (2013.01)

(58) Field of Classification Search
CPC ........... H03K 19/094; H03K 19/09421; H03K 19/0944; H03K 19/1738; H03K 2217/94047
See application file for complete search history.

(56) References Cited

U.S. PATENT DOCUMENTS

| | | | | |
|---|---|---|---|---|
| 6,111,425 A * | 8/2000 | Bertin | ................ | H03K 19/1738 326/23 |
| 6,133,762 A * | 10/2000 | Hill | ..................... | H03K 19/0963 326/119 |
| 7,511,534 B1 * | 3/2009 | Bringivijayaraghavan | .................. | H03K 19/0005 326/87 |
| 7,659,756 B2 * | 2/2010 | Walker | ................... | H03F 3/3001 330/264 |
| 8,193,835 B1 * | 6/2012 | Wong | ............... | H03K 3/356113 327/55 |
| 8,218,377 B2 * | 7/2012 | Tandon | ................... | G11C 5/147 365/189.11 |
| 2002/0021144 A1 * | 2/2002 | Morgan | ........... | H03K 19/00315 326/57 |
| 2004/0119510 A1 * | 6/2004 | Graves | ................. | H03K 17/164 327/108 |
| 2007/0253128 A1 * | 11/2007 | Tiebout | ................... | H03F 1/223 361/56 |
| 2010/0007326 A1 * | 1/2010 | Nakazato | ........... | G01N 27/4148 324/71.5 |
| 2010/0019806 A1 * | 1/2010 | Bien | ....................... | G05F 3/262 327/108 |
| 2012/0092043 A1 * | 4/2012 | Nierop | ............... | H03K 17/6874 327/109 |
| 2017/0323879 A1 * | 11/2017 | Twomey | ................ | H10D 30/65 |

(Continued)

*Primary Examiner* — Jason M Crawford
(74) *Attorney, Agent, or Firm* — Womble Bond Dickinson (US) LLP (57) ABSTRACT

A logic circuit includes: a first cascode circuit including: a first transistor, a second transistor, and a third transistor connected in series, the third transistor connected to an output of the first cascode circuit; and a first diode connected in parallel with the third transistor; and a second cascode circuit connected in series with the first cascode circuit, the second cascode circuit including: a fourth transistor, a fifth transistor, and a sixth transistor connected in series, the sixth transistor connected to an output of the second cascode circuit; and a second diode connected in parallel with the sixth transistor; and wherein the output of the first cascode circuit is connected to the output of the second cascode circuit and connects the first cascode circuit in series with the second cascode circuit.

8 Claims, 5 Drawing Sheets

(56) References Cited

U.S. PATENT DOCUMENTS

| | | | |
|---|---|---|---|
| 2019/0245624 A1* | 8/2019 | Kishi | ............... H01S 5/042 |
| 2022/0238081 A1* | 7/2022 | Jung | ............... G09G 3/3688 |
| 2022/0368297 A1* | 11/2022 | Kim | ............... H03F 3/45219 |
| 2022/0382306 A1* | 12/2022 | Lin | ............... G05F 1/56 |

* cited by examiner

DRIVER/INVERTER USING LOWER VOLTAGE TOLERANT DEVICES

TECHNICAL FIELD

The present disclosure generally relates to an electronic circuit design. In particular, the present disclosure relates to a driver/inverter circuit.

BACKGROUND

Digital logic circuits, also referred to as logic gates, are the building blocks of digital electronics and integrated circuits. A commonly used digital logic circuit includes an inverter (e.g., a NOT gate). The digital logic circuits can perform different logical operations. In a standard cell library, a number of transistors can be connected to create digital logic circuits that perform logical functions. For example, some transistors include field effect transistors (FETs), bipolar junction transistors (BJTs), and insulated-gate bipolar transistors (IGBTs).

SUMMARY

According to one embodiment of the present disclosure, a logic circuit includes: a first cascode circuit including: a first transistor, a second transistor, and a third transistor connected in series, the third transistor connected to an output of the first cascode circuit; and a first diode connected in parallel with the third transistor; and a second cascode circuit connected in series with the first cascode circuit, the second cascode circuit including: a fourth transistor, a fifth transistor, and a sixth transistor connected in series, the sixth transistor connected to an output of the second cascode circuit; and a second diode connected in parallel with the sixth transistor; and wherein the output of the first cascode circuit is connected to the output of the second cascode circuit and connects the first cascode circuit in series with the second cascode circuit.

The first diode may include a first diode-connected transistor and the second diode may include a second diode-connected transistor. The first diode may include a diode-connected positive metal oxide semiconductor (PMOS) device, a gate of the PMOS device being connected to a drain of the PMOS device and connected to the output of the first cascode circuit; and the second diode may include a diode-connected negative metal oxide semiconductor (NMOS) device, a gate of the NMOS device being connected to a drain of the NMOS device and to the output of the second cascode circuit.

The first transistor, the second transistor, and the third transistor may be PMOS transistors; and the fourth transistor, the fifth transistor, and the sixth transistor may be NMOS transistors.

A gate electrode of the second transistor and a gate electrode of the third transistor may be connected to a first bias voltage; a gate electrode of the fifth transistor and a gate electrode of the sixth transistor may be connected to a second bias voltage; and the first bias voltage and the second bias voltage may be dependent on a voltage mode and a first supply voltage. The second bias voltage may be greater than the first bias voltage. The logic circuit may further include: a first input generating circuit connected to the gate electrode of the first transistor and configured to output a first input signal that tracks a data signal ranging between the first bias voltage and the first supply voltage; and a second input generating circuit connected to the gate electrode of the fourth transistor and configured to output a second input signal that tracks a data signal ranging between the second bias voltage and a second supply voltage.

The first diode may be configured to limit a maximum drain to source voltage across the third transistor to less than a tolerance voltage of the third transistor; and the second diode may be configured to limit a maximum drain to source voltage across the sixth transistor to less than a tolerance voltage of the sixth transistor.

According to one embodiment of the present disclosure, a logic circuit includes: a first cascode circuit including a first transistor, a second transistor, and a third transistor connected in series, the third transistor connected to an output of the first cascode circuit; a second cascode circuit including, a fourth transistor, a fifth transistor, and a sixth transistor connected in series, the sixth transistor connected to an output of the second cascode circuit; a seventh transistor connected in parallel with the third transistor, the seventh transistor including a gate electrode connected to a drain electrode of the fifth transistor, the seventh transistor connected to the output of the first cascode circuit; and an eighth transistor connected in parallel with the sixth transistor, the eighth transistor including a gate electrode connected to a drain electrode of the second transistor, the eighth transistor connected to the output of the second cascode circuit; wherein the output of the first cascode circuit is connected to the output of the second cascode circuit.

The seventh transistor and eighth transistor may be configured to limit a maximum drain to source voltage across the third transistor to less than a tolerance voltage of the third transistor and to limit a maximum drain to source voltage across the sixth transistor to less than a tolerance voltage of the sixth transistor.

A drain to source voltage across the seventh transistor may be less than a tolerance voltage of the seventh transistor; and a drain to source voltage across the eighth transistor may be less than a tolerance voltage of the eighth transistor.

The logic circuit may further include: a first input generating circuit connected to the gate electrode of the first transistor and configured to output a first input signal that tracks a data signal ranging between a first bias voltage and a first supply voltage; and a second input generating circuit connected to the gate electrode of the fourth transistor and configured to output a second input signal that tracks the data signal ranging between a second bias voltage and a second supply voltage.

The seventh transistor may include a PMOS transistor; and the eighth transistor may include a NMOS transistor.

A source electrode of the first transistor may be connected to a first supply voltage; and a source electrode of the fourth transistor may be connected to a second supply voltage.

According to one embodiment of the present disclosure, a non-transitory computer-readable medium includes stored instructions, which when executed by a processor, cause the processor to generate a digital representation of an integrated circuit including: a first cascode circuit including a first transistor, a second transistor, and a third transistor connected in series, the third transistor connected to an output of the first cascode circuit; a second cascode circuit including, a fourth transistor, a fifth transistor, and a sixth transistor connected in series, the sixth transistor connected to an output of the second cascode circuit; a seventh transistor connected in parallel with the third transistor, the seventh transistor including a gate electrode connected to a drain electrode of the fifth transistor and a drain electrode connected to the output of the first cascode circuit; and an eighth transistor connected in parallel with the sixth transistor, the eighth transistor including a gate electrode connected to a drain electrode of the second transistor and a drain electrode connected to the output of the second cascode circuit; wherein the output of the first cascode circuit is connected to the output of the second cascode circuit and connects the first cascode circuit in series with the second cascode circuit.

A source electrode of the first transistor may be connected to a supply voltage; and the first transistor, the second transistor, the third transistor, the fourth transistor, the fifth transistor, the sixth transistor, the seventh transistor, and the eighth transistor may have a drain to source tolerance voltage less than the supply voltage.

The first transistor, the second transistor, the third transistor, and the seventh transistor may include PMOS transistors; and the fourth transistor, the fifth transistor, the sixth transistor, and the eighth transistor may include NMOS transistors.

The integrated circuit may be configured to operate in a voltage mode defined by a supply voltage.

A first voltage mode may be defined by the supply voltage including approximately 3.3V, a second voltage mode may be defined by the supply voltage including approximately 2.5V, and a third voltage mode may be defined by the supply voltage including approximately 1.8V.

The integrated circuit may further include: a first input generating circuit connected to a gate electrode of the first transistor and configured to output a first input signal that tracks a data signal ranging between a first bias voltage and a supply voltage; and a second input generating circuit connected to a gate electrode of the fourth transistor and configured to output a second input signal that tracks a data signal ranging between a second bias voltage and a ground voltage.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to drivers/inverters using low voltage tolerant devices.

Transistors have been shrinking in size over time and accordingly, the voltage needed to drive the transistors has also decreased. However, transistors may still need to operate in spite of higher voltage, such as accepting higher input voltages that are output by other devices. One issue with accepting or operating with higher voltages is that the transistors may experience excessive wear and may fail earlier than desired. For example, metal oxide semiconductor field effect transistors (MOSFETs) may experience gate oxide break down due to operating close to or beyond their specified maximum operating voltages.

Digital logic circuits, such as inverters, may be implemented using metal oxide semiconductor field effect transistors (MOSFETs). While implementations for inverters exist, the implementations may not work properly in some situations. For example, an inverter may need to accept an input signal having a higher voltage than a maximum operating voltage, also referred to as a tolerance voltage, of the transistors that make up the inverter. A tolerance voltage may be specified for every type of device in a given semiconductor process technology library (e.g., may be specified by a semiconductor foundry supporting the semiconductor process technology library), where operating a device at voltages greater than the tolerance voltage of that device will lead to overvoltage stress, which will degrade the device over time and cause functional failure of the fabricated integrated circuit. This may occur when an inverter is used in an input/output (I/O) module configured to accept logical signals at one or more different logic supply voltages. In such cases, the higher voltage may damage the transistors and the transistors may fail prematurely. For instance, in some examples, a higher voltage across a transistor (e.g., between a drain electrode and source electrode of the transistor) may cause breakdown of a dielectric of a transistor.

Examples of the present disclosure protect transistors that make up an inverter logic circuit and/or driver circuit from experiencing damaging voltages in both the steady state and during transitions. To accomplish this, examples of the present disclosure use a first cascode circuit and a second cascode circuit. A transistor with a parallel diode is added in series for both the first cascode circuit and the second cascode circuit. The additional transistors and diodes ensure that the drain to source voltage across transistors in the circuit does not exceed their tolerance threshold. Alternatively, examples of the present disclosure add a pair of transistors to both the first cascode circuit and the second cascode circuit with each of the two pairs having a transistor tapped into the gate of the other of the two pairs. The added pair of transistors similarly ensure that the drain to source voltage across transistors in the circuit do not exceed their tolerance threshold.

Technical advantages of the present disclosure include, but are not limited to, safe (e.g., non-damaging) voltage levels across transistors (e.g., below the breakdown voltage of the transistors) in the inverter and/or driver circuit during both static and transitory states, decreased complexity of the circuit, decreased physical size (e.g., small area) of the circuit, scalable design for various input voltages, and reduced coupling and routing complexity for the circuit.

Figure 1:
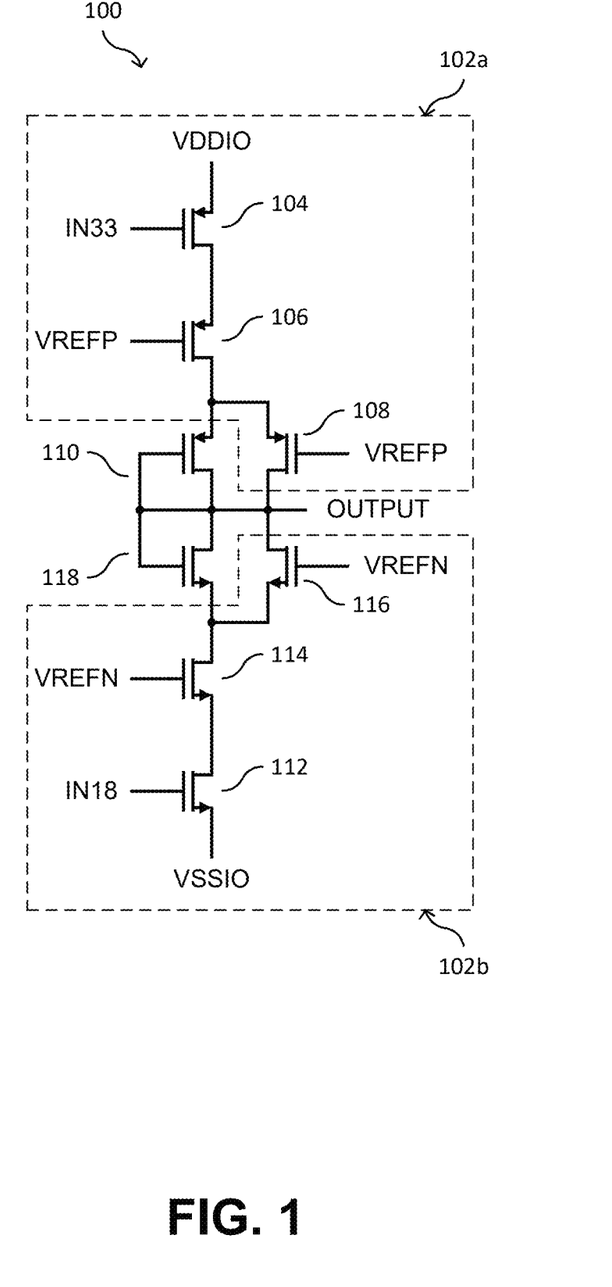
FIG. 1 is a circuit diagram illustrating an example digital inverter circuit according to an aspect of the present disclosure.

FIG. 1 is a circuit diagram illustrating an example digital inverter circuit 100 according to an aspect of the present disclosure. The logic circuit 100 includes a first cascode circuit 102a and a second cascode circuit 102b. The first cascode circuit includes a first transistor 104, a second transistor 106, and a third transistor 108 that are connected in series. In some examples, the first cascode circuit 102a includes a first diode 110 connected in parallel with the third transistor 108. The first transistor 104, the second transistor 106, and the third transistor 108 are p-type metal oxide semiconductor (PMOS) field effect transistors (FETs). The first transistor 104 has a source electrode connected to a supply voltage VDDIO. The supply voltage VDDIO may be provided by a voltage source, such as a power supply, which provides power to the digital inverter circuit 100. The first transistor 104 also has a gate electrode connected to an input signal IN33. As discussed in more detail below with respect to FIG. 2A, input signal IN33 is derived from, and partially follows, a data input signal. A drain electrode of the first transistor 104 is connected to a source electrode of the second transistor 106. The second transistor 106 includes a gate electrode connected to a first bias input signal VREFP (e.g., input voltage) and a drain electrode connected to a source electrode of the third transistor 108. The drain electrode of the second transistor 106 is also connected to a first diode 110. The third transistor 108 includes a gate electrode which, in similarity with the second transistor 106, is connected to the first bias input signal VREFP (e.g., input voltage). The third transistor 108 also includes a drain electrode which is connected to an output electrode OUTPUT.

The second cascode circuit 102b includes a fourth transistor 112, a fifth transistor 114, and a sixth transistor 116 that are connected in series. In some examples, the second cascode circuit 102b includes a second diode 118 connected in parallel with the sixth transistor 116. The fourth transistor 112, the fifth transistor 114, and the sixth transistor 116 are n-type metal oxide semiconductor (NMOS) field effect transistors (FETs). The fourth transistor 112 has a source electrode connected to a ground voltage VSSIO. The ground voltage VSSIO may be provided by a voltage source, such as a power supply, which provides power to the digital logic circuit 100. The fourth transistor 112 also has a gate electrode connected to an input signal IN18. As discussed in more detail below with respect to FIG. 2B, input signal IN18 is derived from, and partially follows, a data input signal. A drain electrode of the fourth transistor 112 is connected to a source electrode of the fifth transistor 114. The fifth transistor 114 includes a gate electrode connected to a second bias input signal VREFN and a drain electrode connected to a source electrode of the sixth transistor 116. The drain electrode of the fifth transistor 114 is also connected to a second diode 118. The sixth transistor 116 includes a gate electrode which, in similarity with the fifth transistor 114, is connected to the second bias input signal VREFN. The sixth transistor 116 also includes a drain electrode which is connected to an output electrode OUTPUT.

As illustrated in FIG. 1, the first diode 110 is connected in parallel with the third transistor 108 while the second diode 118 is connected in parallel with the sixth transistor 116. In the example illustrated in FIG. 1, both the first diode 110 and the second diode 118 are implemented using diode-connected transistors with the first diode 110 being a p-type FET and the second diode 118 being an n-type FET, although examples of the present disclosure are not limited thereto. The first diode 110 includes a source electrode connected to the drain electrode of the second transistor 106. The first diode 110 also includes a gate electrode and a drain electrode that are shorted together (such that the PMOS transistor of the first diode 110 is diode-connected) and connected to the output electrode OUTPUT. As with the first diode 110, the second diode 118 includes a source electrode connected to the drain electrode of the fifth transistor 114. The second diode 118 also includes a gate electrode and a drain electrode that are shorted together (such that the NMOS transistor of the second diode 118 is diode-connected) and connected to the output electrode OUTPUT. The first diode 110's gate and drain electrodes are connected to the second diode 118's gate and drain electrodes.

In some examples, the first diode 110 and the second diode 118 of the digital inverter circuit 100 are passive diodes and not diode-connected transistors. The first and second diodes are then passive elements of the circuit instead of active, as with the diode-connected transistors. The passive diodes may operate in an analogous manner as the diode-connected transistors. For example, the diodes may include a voltage drop (e.g., a forward voltage) that is similar to a threshold voltage Vth of the diode-connected transistors used for the first diode 110 and the second diode 118. In some examples, the voltage drop across the passive diodes matches a threshold voltage Vth of their parallel connected transistors (e.g., the third transistor 108 and the sixth transistor 116). In some semiconductor manufacturing process technologies, diode-connected transistors are physically smaller than a diode having similar electrical characteristics.

Figure 2A:
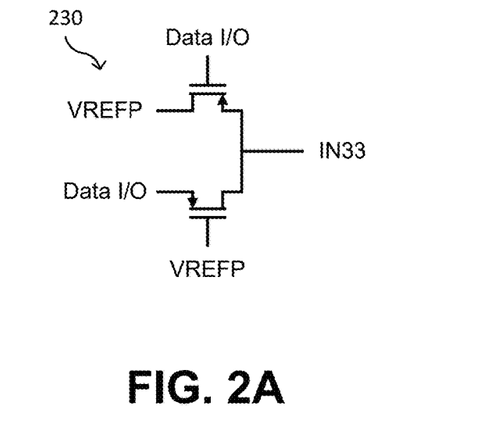
FIG. 2A is a circuit diagram for an input signal according to an aspect of the present disclosure.
Figure 2B:
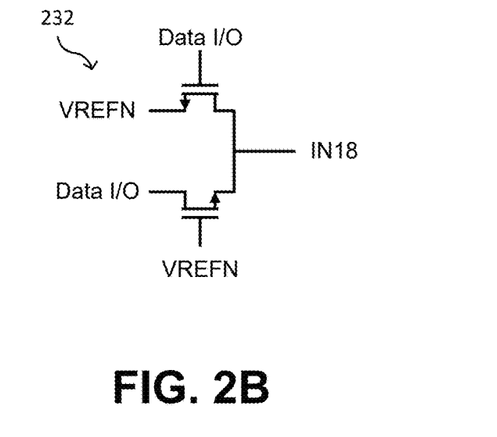
FIG. 2B is a circuit diagram for another input signal according to an aspect of the present disclosure.
Figure 4:
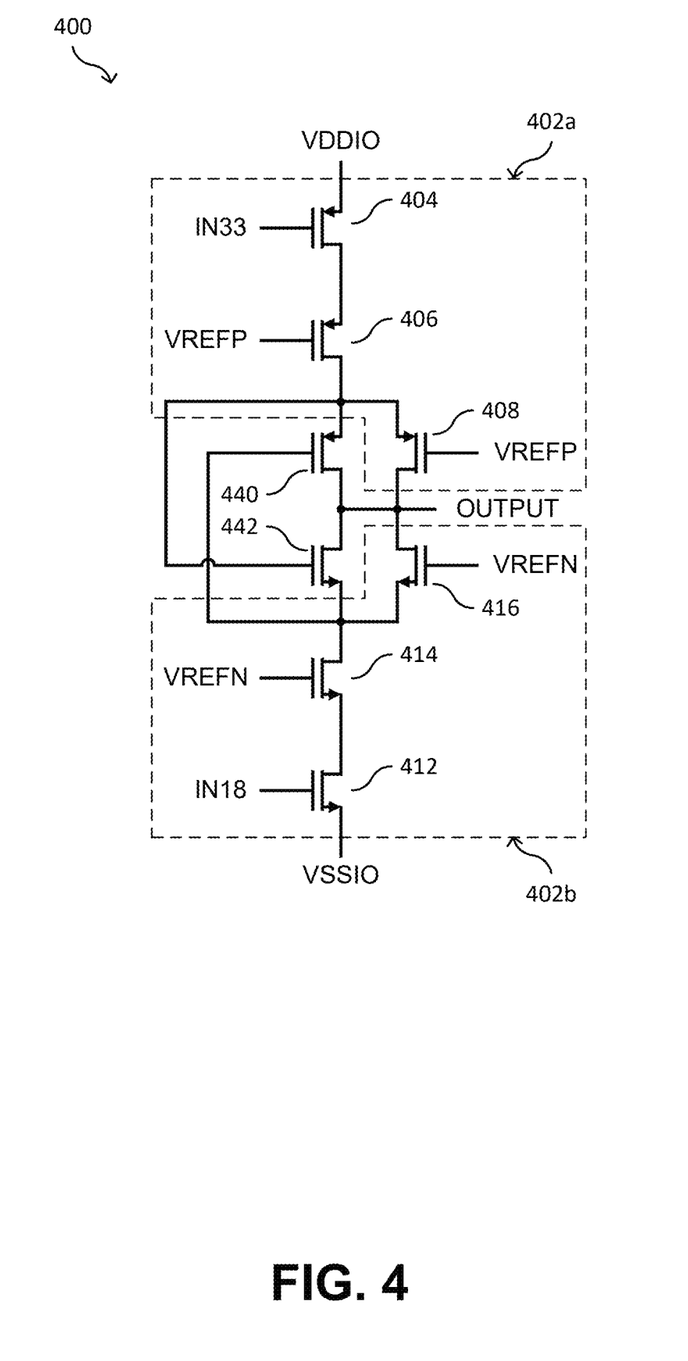
FIG. 4 is a circuit diagram illustrating an example digital inverter circuit according to an aspect of the present disclosure.

FIG. 2A and FIG. 2B are circuit diagrams of a first input generating circuit 230 and a second input generating circuit 232 that are used to derive the input signals IN33 and IN18 used in the examples of FIG. 1 and FIG. 4. The first input generating circuit 230 includes two p-type transistors and the second input generating circuit 232 includes two n-type transistors. The input signal IN33 is derived from an input data signal DATA I/O and a first bias input signal VREFP, which are connected to the two p-type transistors of the first input generating circuit 230. The input signal IN18 is derived from the input data signal DATA I/O and a second bias input signal VREFN, which are connected to the two n-type transistors of the second input generating circuit 232. The input data signal DATA I/O may range between a ground voltage VSSIO and a supply voltage VDDIO which include a logical low/off state and a logical high/on state.

In some examples, VSSIO is set at 0V (e.g., ground) while VDDIO is set at 3.3V. Alternatively, in some examples, VDDIO is set at 2.5V while in some examples, VDDIO is set at 1.8V. VSSIO may also be set to voltages other than 0V. The actual voltage of VDDIO and/or VSSIO may be slightly higher or lower (e.g., +/−0.5V) than the set value. A person having ordinary skill in the art will appreciate VSSIO and VDDIO may take values other than the outlined examples and are not limited to such examples. For instance, VDDIO may be set to a value between 0V-5V.

Figure 2C:
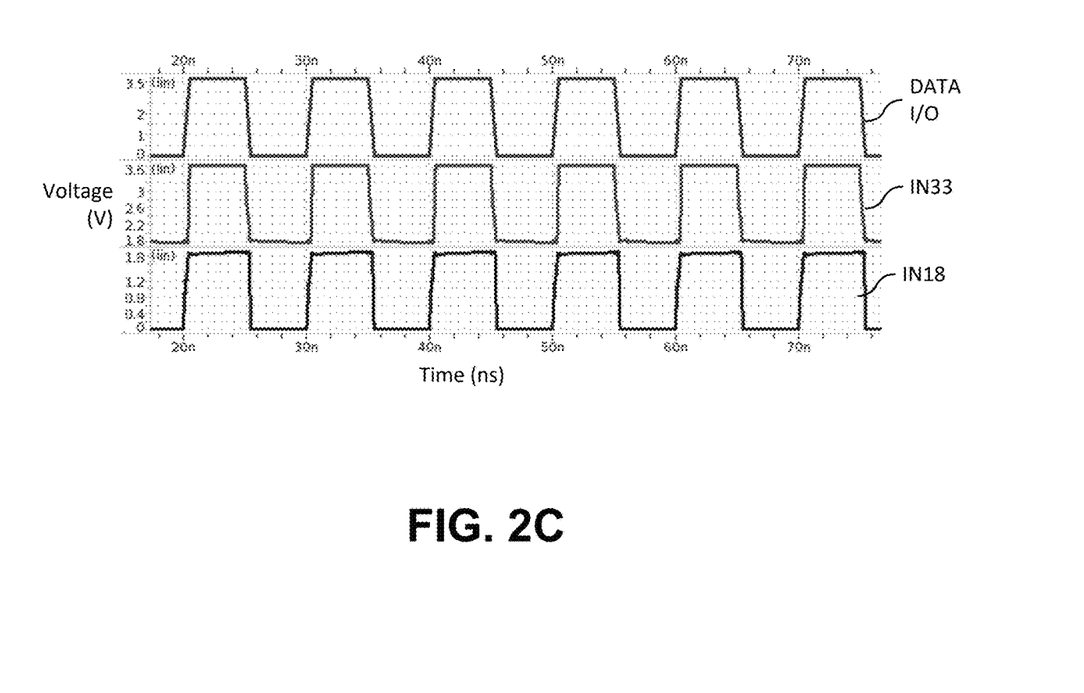
FIG. 2C illustrates a waveform of a data input signal relative to the input signals of FIG. 2A and FIG. 2B.

Further in FIG. 2A/B, the input data signal DATA I/O is split between the input signal IN33 and the input signal IN18. For example, in operation of FIG. 2A/2B, the input signal IN33 tracks the DATA I/O signal ranging between a first bias voltage VREFP and a supply voltage VDDIO. IN33 follows the DATA I/O signal when the DATA I/O signal is greater than VREFP, while IN33 follows VREFP when the DATA I/O signal is less than or equal to VREFP. In comparison, the input signal IN18 tracks the DATA I/O signal ranging between a second bias voltage VREFN and a ground voltage VSSIO. IN18 follows the DATA I/O signal when the DATA I/O signal is less than VREFN, while IN18 follows VREFN when the DATA I/O signal is greater than or equal to VREFN. Accordingly, if the DATA I/O signal is high at VDDIO, the input signal IN33 follows the DATA I/O signal which is high at VDDIO and the input signal IN18 is high at the second bias voltage VREFN. Further, if the DATA I/O signal is low at VSSIO, the input signal IN33 is low at the second bias voltage VREFP and the input signal IN18 follows the DATA I/O signal which is low at VSSIO. An example waveform of how the DATA I/O signal is related to the input signal IN33 and the input signal IN18 is illustrated in FIG. 2C.

In the example of FIG. 2A/B, the first and second bias voltages VREFP and VREFN are provided by a bias voltage generator. Additionally, the first and second bias voltages VREFP and VREFN may be set by the bias voltage generator based on VDDIO and/or may be dependent on a voltage mode in which the integrated circuit is operating. A voltage mode may be defined as a mode in which a specified voltage represents a logical high or logic on. For instance, a 3.3V voltage mode represents a mode in which 3.3V represents a logical high/on state. In some examples, the second bias voltage VREFN is 52% of VDDIO in a 3.3V voltage mode while the first bias voltage is VREFP 48% of VDDIO in the 3.3V voltage mode. Alternatively, in some examples, the second bias voltage VREFN is 66% of VDDIO in a 2.5V voltage mode while the first bias voltage VREFP is 33% of VDDIO in the 2.5V voltage mode. In further alternative examples, the second bias voltage VREFN is set to VDDIO in a 1.8V voltage mode while the first bias voltage VREFP is set to 0V in the 1.8V voltage mode. Other voltage modes are contemplated and the first and second bias voltages VREFP and VREFN may include various portions of a supply voltage (e.g., VDDIO). VREFN is generally used to bias NMOS and VREFP is used to bias PMOS. Some aspects of embodiments of the present disclosure relate to controlling NMOS and PMOS transistors in the cascoded inverter structures according to various embodiments of the present disclosure, to have substantially the same drive strength by supplying the same gate-source voltage (Vgs) to the NMOS transistors and the PMOS transistors. In some embodiments, this condition is met when VDDIO−VREFP=VREFN−VSSIO and VREFN>VREFP.

Referencing FIG. 1 and FIG. 2A/B, in operation of the example logic circuit 100 of FIG. 1, the first transistor 104 and the fourth transistor 112 receive the input signals IN33 and IN18, respectively. The input signals IN33 and IN18 are derived from the input data signal DATA I/O. Accordingly, when the input data signal DATA I/O is in a logical high/on state, IN33 and IN18 are in a logical high/on state. As IN33 is an input to the first transistor 104, which is a p-type transistor, when IN33 is in a logical high/on state, the first transistor 104 is inactive. Further, as IN18 is an input to the fourth transistor 112, which is an n-type transistor, when IN18 is in a logical high/on state, the fourth transistor 112 is active. With the fourth transistor 112 active, the output electrode OUTPUT may be pulled to a low state (e.g., VSSIO) through the fifth transistor 114 and the sixth transistor 116.

Additionally, when the input data signal DATA I/O is in a logical low/off state, IN33 and IN18 are in a logical low/off state. Again, as IN33 is an input to the first transistor 104, which is a p-type transistor, when IN33 is in a logical low/off state, the first transistor 104 is active. With the first transistor 104 active, the output electrode OUTPUT may be pulled to a high state (e.g., VDDIO) through the second transistor 106 and the third transistor 108. Further, as IN18 is an input to the fourth transistor 112, when IN18 is in a logical high/on state, the fourth transistor 112 is inactive.

Thus, the logic circuit 100 acts as a logical inverter circuit (e.g., a NOT gate) whereby the OUTPUT includes an inverted signal (a logical inverse) of the input data signal DATA I/O. For example, when the input data signal DATA I/O is in a logical low/off state, the OUTPUT data signal is in a logical high/on state. Conversely, when the input data signal DATA I/O is in a logical high/on state, the OUTPUT data signal is in a logical low/off state.

In the above-described operation, the voltage across each of the transistors (e.g., the drain to source voltage) may change depending on the input signals IN33 and IN18 as well as on the output signal OUTPUT. It is advantageous to ensure the voltages across each of the transistors are below their tolerance voltage(s), even for momentary transitions between states. If, for example, a voltage across a transistor in the logic circuit 100 exceeds its tolerance voltage, the transistor's dielectric may break down and cause damage to the transistor. However, by adding the first diode 110 and the second diode 118 in parallel with the third transistor 108 and sixth transistor 116 respectively, the voltages across each of the transistors in the logic circuit 100 are below the tolerance limits of those transistors. For instance, in some examples, a tolerance voltage limit or threshold for transistors used in FIG. 1 and/or in FIG. 4 is approximately 2V.

In the example of FIG. 1, given a case where the input signal DATA I/O is in a logical high/on state (e.g., VDDIO) such that the first transistor 104 is inactive (because input signal IN33 is high, e.g., approximately 3.3V as shown in FIG. 2C) and the fourth transistor 112 is active (because input signal IN18 is high, e.g., approximately 1.8V as shown in FIG. 2C), the output electrode OUTPUT is pulled to a logical low/off state (e.g., VSSIO). With the OUTPUT in a logical low/off state, the third transistor 108 is inactive while the first diode 110 is active. The first diode 110, which is a p-type transistor, will be active as there is not sufficient voltage applied to its gate electrode to prevent current flow. As such, a voltage at a source terminal of the first diode 110 is raised by a threshold voltage of the first diode 110. The threshold voltage may take many values, however, in examples such as the illustrated example of FIG. 1, the threshold voltage of the first diode ranges between 0.5V-1.0V (e.g., 0.6V). As a source electrode of the first diode 110 is connected to a drain electrode of the second transistor 106, the drain voltage at the second transistor 106 is increased by approximately the threshold voltage of the first diode 110. Because the voltage is higher at the drain electrode of the second transistor 106, the voltage across the second transistor 106 (e.g., drain to source voltage) is reduced. This effect continues with the first transistor 104 as the voltage at the drain electrode of the first transistor 104 is increased. Accordingly, the voltage across the first transistor 104 (e.g., drain to source voltage) is reduced. The reduction in the voltage across the first transistor 104 and the second transistor 106 ensures their drain to source voltages are lower than their tolerance voltages.

In the example of FIG. 1, given a case where DATA I/O is in a logical low/off state (e.g., VSSIO) such that the first transistor 104 is active (because input signal IN33 is low, e.g., approximately 1.8V as shown in FIG. 2C) and the fourth transistor 112 is inactive (because input signal IN18 is low, e.g., 0V as shown in FIG. 2C), the output electrode OUTPUT is pulled to a logical high/on state (e.g., VDDIO). With the OUTPUT in a logical high/on state, the first diode 110 may no longer be active as the gate electrode of the first diode 110, which is a p-type transistor, is receiving sufficient voltage to prevent current flow. However, the third transistor 108 will be active and the output electrode OUTPUT may be pulled high through the third transistor 108, through the second transistor 106, and through the first transistor 104 to VDDIO. Accordingly, a voltage at a source electrode and at a drain electrode for each of the first transistor 104, the second transistor 106, and the third transistor will be approximately VDDIO. The drain to source voltage across each of the transistors will thus be approximately 0V.

Continuing with the example of FIG. 1, given the first transistor 104 is active and the fourth transistor 112 is inactive, the output electrode OUTPUT is pulled to a logical high/on state (e.g., VDDIO). With the OUTPUT in a logical high/on state, the sixth transistor 116 is inactive while the second diode 118 is active. However, a threshold voltage is necessary to activate the second diode 118. The threshold voltage is the voltage required by a gate electrode of a transistor to activate. The threshold voltage may take many values, however, in examples such as the illustrated example of FIG. 1, the threshold voltage of the second diode 118 ranges between 0.5V-1.0V. As a source electrode of the second diode 118 is connected to a drain electrode of the fifth transistor 114, the drain voltage at the fifth transistor 114 is reduced by approximately the threshold voltage of the second diode 118. Because the voltage is lower at the drain electrode of the fifth transistor 114, the voltage across the fifth transistor 114 (e.g., drain to source voltage) is reduced. This effect continues with the fourth transistor 112 as the voltage at the drain electrode of the fourth transistor 112 is reduced. Accordingly, the voltage across the fourth transistor 112 (e.g., drain to source voltage) is reduced. The reduction in the voltage across the fourth transistor 112 and the fifth transistor 114 ensures the voltage across the two transistors is lower than their tolerance voltages.

In the example of FIG. 1, again given a case where DATA I/O is in a logical high/on state (e.g., VDDIO) such that the first transistor 104 is inactive (because input signal IN33 is high, e.g., approximately 3.3V as shown in FIG. 2C) and the fourth transistor 112 is active (because input signal IN18 is high, e.g., approximately 1.8V as shown in FIG. 2C), the output electrode OUTPUT is pulled to a logical low/off state (e.g., VSSIO). With the OUTPUT in a logical low/off state, the second diode 118 may no longer be active as the voltage applied to the gate electrode of the second diode 118 is less than a threshold voltage. However, the sixth transistor 116 will be active and the output electrode OUTPUT may be pulled low through the sixth transistor 116, through the fifth transistor 114, and through the fourth transistor 112 to VSSIO. Accordingly, a voltage at a source electrode and at a drain electrode for each of the sixth transistor 116, the fifth transistor 114, and the fourth transistor 112 will be approximately VSSIO. The drain to source voltage across each of the transistors will thus be approximately 0V.

Figure 3:
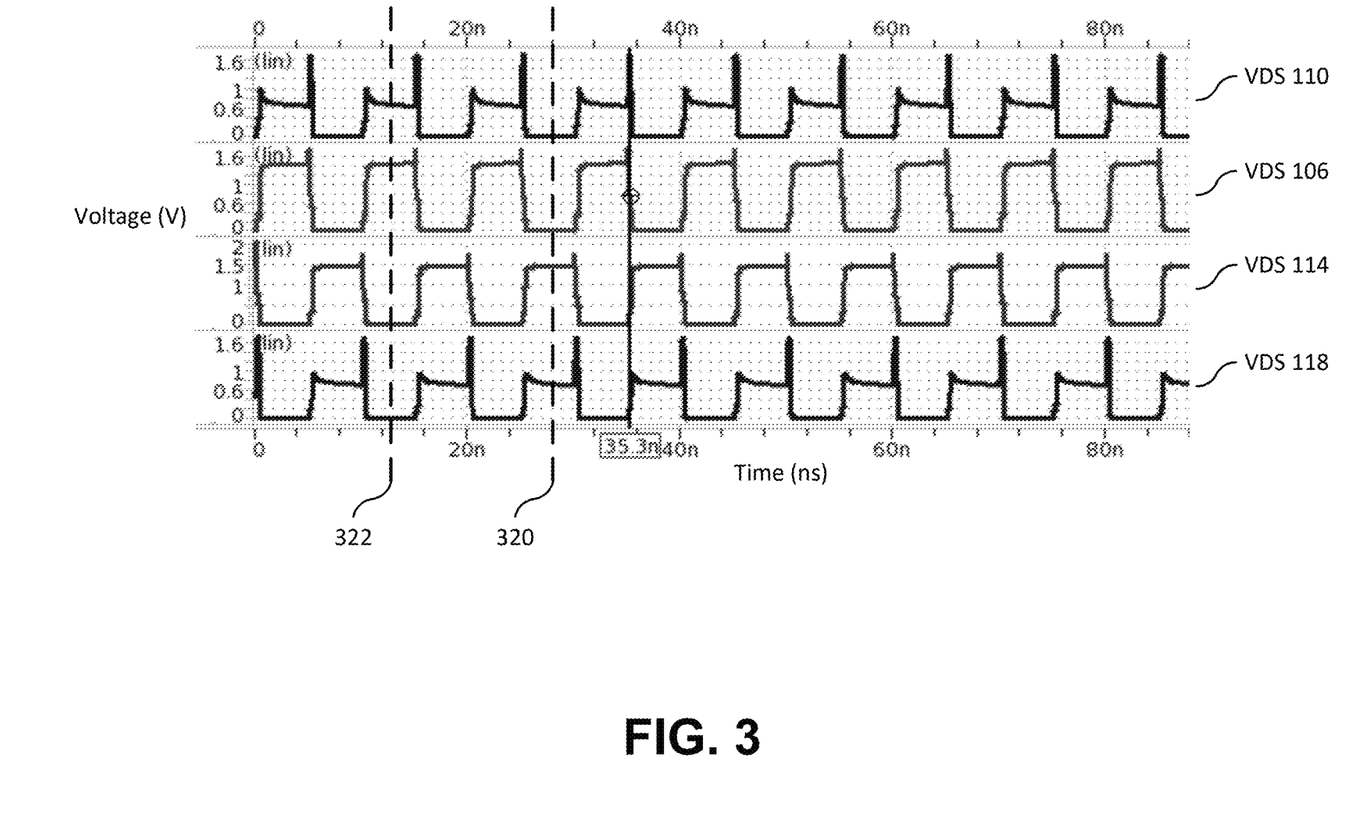
FIG. 3 illustrates example voltage waveforms taken at different points within the example digital inverter circuit of FIG. 1.

Now referencing FIG. 3, FIG. 3 illustrates example voltage waveforms taken at different points within the example digital inverter circuit of FIG. 1. In FIG. 3, the waveforms are generated with a periodic input signal (e.g., DATA I/O of FIG. 2A/B/C) that varies between a logical high and a logical low. The topmost waveform represents a drain to source voltage (VDS) across the first diode 110, the next lower waveform represents a drain to source voltage across the second transistor 106, the next lower waveform represents a drain to source voltage across the fifth transistor 114, and the lowermost waveform represents a drain to source voltage across the second diode 118. As illustrated by the waveforms, the drain to source voltages change between two states with one state being at approximately 0V and another state being at a higher voltage. The higher voltage, though, is less than a tolerance voltage for each of the respective transistors. The two states correspond to the various transistors' reaction to a periodic input signal.

For example, at point 320, the drain to source voltage across the first diode 110 and the second transistor 106 is approximately 0V when an input signal (e.g., DATA I/O) is in a logical low/off state and an output signal (e.g., OUTPUT) is in a logical high/on state. However, during the same time, the drain to source voltage across the fifth transistor 114 and the second diode 118 are at higher voltages. Conversely, at point 322, the drain to source voltage across the first diode 110 and the second transistor 106 is at a higher voltage when an input signal (e.g., DATA I/O) is in a logical high/on state and an output signal (e.g., OUTPUT) is in a logical low/off state. During the same time, the drain to source voltage across the fifth transistor 114 and the second diode 118 are at approximately 0V.

As further illustrated in FIG. 3, the waveforms have transient voltages when their drain to source voltage changes between a near 0V state and a higher voltage state. However, the transient voltages remain below the tolerance voltage for each of the transistors. This is advantageous over previous inverter circuit designs. For instance, transistors within previous inverter circuits could have transient voltages greater than their tolerance voltages, even if their steady state voltages are less than their tolerance voltages.

FIG. 4 is a circuit diagram illustrating an example digital inverter circuit 400 (or logic circuit) according to an aspect of the present disclosure. The logic circuit 400 includes a first cascode circuit 402a and a second cascode circuit 402b. The first cascode circuit 402a includes a first transistor 404, a second transistor 406, and a third transistor 408 that are connected in series. The first transistor 404, the second transistor 406, and the third transistor 408 are p-type metal oxide semiconductor (PMOS) field effect transistors (FETs). The first transistor 404 has a source electrode connected to a supply voltage VDDIO. The supply voltage VDDIO may be provided by a voltage source, such as a power supply, which provides power to the digital inverter circuit 400. The first transistor 404 also has a gate electrode connected to an input signal IN33. The input signal IN33 is derived from, and partially follows, a data input signal (e.g., DATA I/O) as is described with respect to FIG. 2A/B. A drain electrode of the first transistor 404 is connected to a source electrode of the second transistor 406. The second transistor 406 includes a gate electrode connected to a first bias input signal VREFP (e.g., input voltage) and a drain electrode connected to a source electrode of the third transistor 408. The drain electrode of the second transistor 406 is also connected to a source electrode of a seventh transistor 440 and to a gate electrode of an eighth transistor 442. The source electrode of the third transistor 408 is also connected to the source electrode of the seventh transistor 440 and to the gate electrode of the eighth transistor 442. The third transistor 408 includes a gate electrode which, in similarity with the second transistor 406, is connected to the first bias input signal VREFP. The third transistor also includes a drain electrode which is connected to an output electrode OUTPUT.

The second cascode circuit 402b includes a fourth transistor 412, a fifth transistor 414, and a sixth transistor 416 that are connected in series. The fourth transistor 412, the fifth transistor 414, and the sixth transistor 416 are n-type metal oxide semiconductor (NMOS) field effect transistors (FETs). The fourth transistor 412 has a source electrode connected to a ground voltage VSSIO. The ground voltage VSSIO may be provided a voltage source, such as a power supply, which provides power to the digital logic circuit 400. The fourth transistor 412 also has a gate electrode connected to an input signal IN18. The input signal IN18 is derived from, and partially follows, a data signal as is described with respect to FIG. 2A/B. A drain electrode of the fourth transistor 412 is connected to a source electrode of the fifth transistor 414. The fifth transistor 414 includes a gate electrode connected to a second bias input signal VREFN and a drain electrode connected to a source electrode of the sixth transistor 416. The drain electrode of the fifth transistor 414 is also connected to a source electrode of the eighth transistor 442 and to a gate electrode of the seventh transistor 440. The source electrode of the sixth transistor 416 is also connected to the source electrode of the eighth transistor 442 and to the gate electrode of the seventh transistor 440. The sixth transistor 416 includes a gate electrode which, in similarity with the fifth transistor 414, is connected to the second bias input signal VREFN. The sixth transistor 416 also includes a drain electrode which is connected to the output electrode OUTPUT.

In FIG. 4, the seventh transistor 440 is a p-type transistor while the eighth transistor 442 is an n-type transistor. Accordingly, when the gate electrode of the seventh transistor 440 is in a logical low/off state, current flows between the source electrode and the drain electrode and to the output electrode OUTPUT. Further, when the gate electrode of the eighth transistor 442 is in a logical high/on state, current flows between the source electrode and the drain electrode and to the output electrode OUTPUT.

Referencing FIG. 4 and FIG. 2A/B, in operation of the example logic circuit 400 of FIG. 4, the first transistor 404 and the fourth transistor 412 receive the input signals IN33 and IN18, respectively. As described elsewhere herein, the input signals IN33 and IN18 are partially derived from the input data signal DATA I/O. Accordingly, when the input data signal DATA I/O is in a logical high/on state, IN33 and IN18 are in a logical high/on state. As IN33 is an input to the first transistor 404, which is a p-type transistor, when IN33 is in a logical high/on state, the first transistor 404 is inactive. Further, as IN18 is an input to the fourth transistor 412, which is an n-type transistor, when IN18 is in a logical high/on state, the fourth transistor 412 is active. With the fourth transistor 412 active, the output electrode OUTPUT may be pulled to a low state (e.g., VSSIO) through the fifth transistor 414, the sixth transistor 416, and the eighth transistor 442. The output electrode OUTPUT is pulled to the logical low/off state through the eighth transistor 442 because when the output electrode OUTPUT is transitioning from the logical high/on state, the third transistor 408 is active, which in turn activates the eighth transistor 442 due to the gate electrode of the eighth transistor 442 receiving a voltage above its threshold voltage through the third transistor 408. However, in the transition of the output electrode OUTPUT being pulled to a logical low/off state, the voltage at the gate electrode of the eighth transistor 442 will eventually fall below its threshold voltage, and at such a time, the output electrode OUTPUT will be pulled to the logical low/off state through the sixth transistor 416.

Additionally, when the input data signal DATA I/O is in a logical low/off state, IN33 and IN18 are in a logical low/off state. Again, as IN33 is an input to the first transistor 404, which is a p-type transistor, when IN33 is in a logical low/off state, the first transistor 404 is active. Further, as IN18 is an input to the fourth transistor 412, when IN18 is in a logical low/off state, the fourth transistor 412 is inactive. With the first transistor 404 active, the output electrode OUTPUT may be pulled to a logical high state (e.g., VDDIO) through the second transistor 406, the third transistor 408, and the seventh transistor 440. The output electrode OUTPUT is pulled to the logical high/on state through the seventh transistor 440 because when the output electrode OUTPUT is transitioning from the logical low/off state, the sixth transistor 416 is active, which in turn activates the seventh transistor 440 due to the gate electrode of the seventh transistor 440 receiving a voltage that is not sufficient to prevent current flow through the sixth transistor 416. However, in the transition of the output electrode OUTPUT being pulled to a logical high/on state, the voltage at the gate electrode of the seventh transistor 440 will eventually exceed a voltage that is sufficient to prevent current flow through the seventh transistor 440, and at such a time, the output electrode OUTPUT will be pulled to the logical high/on state through the third transistor 408.

Thus, the logic circuit 400 acts as a logical inverter circuit (e.g., a NOT gate) whereby the OUTPUT includes an inverted signal of the input data signal DATA I/O. For example, when the input data signal DATA I/O is in a logical low/off state, the OUTPUT data signal is in a logical high/on state. Conversely, when the input data signal DATA I/O is in a logical high/on state, the OUTPUT data signal is in a logical low/off state.

When the logic circuit 400 is operating as an inverter, the input signals IN33 and IN18 may have a brief overlapping portion, whereby the first transistor 404 and the fourth transistor 412 may both be active simultaneously. For example, as illustrated in FIG. 2C, the IN33 and IN18 waveforms are not perfect and require some time to ramp up from a low state to a high state and some time to ramp down from a high state to a low state. During these brief periods, all the transistors may be active and VDDIO may connect through them to VSSIO (e.g., a brief short circuit). However, this does not affect the operation of the logic circuit 400 and may be advantageous as the logic circuit 400 can accept a simultaneous change in the input signals IN33 and IN18.

In comparison, in some examples, a digital driver circuit may be implemented using the digital inverter circuit 400 of FIG. 4. To implement a digital driver circuit using the digital invert circuit 400 of FIG. 4, the input signals IN33 and IN18 are adjusted. Specifically, the input signals IN33 and IN18 are adjusted such that if the first transistor 404 is active, the fourth transistor 412 is inactive, and if the fourth transistor 412 is active, the first transistor 404 is inactive. In this way, only the first cascode circuit 402a or the second cascode circuit 402b is active at any point in time. For example, only half of the digital inverter circuit 400 is active at one time (e.g., the portion of the circuit having PMOS transistors or the portion of the circuit having NMOS transistors). Accordingly, there will not be a brief period where all the transistors are on and there will not be a brief period where VDDIO is connected through the transistors to VSSIO (e.g., a brief short circuit).

In some examples, multiple digital inverter circuits 400 may be combined. In some such examples, combining multiple digital inverter circuits 400 may enable the digital inverter circuits to be connected to, and to drive, larger loads than if only one digital inverter circuit is used. Further, by combining multiple digital inverter circuits 400, multiple digital driver circuits may be combined and similarly driver larger loads.

In some examples, to combine multiple digital inverter circuits 400, each of the inputs (e.g., input signals IN33 and IN18) and the outputs (e.g., OUTPUT) are connected. For instance, a first digital inverter circuit may be connected to inputs IN33 and IN18 with a second digital inverter circuit connected to the same inputs IN33 and IN18. Further, the first digital inverter circuit's OUTPUT (e.g., output electrode) may be connected to the second digital inverter circuits' OUTPUT (e.g., output electrode).

When operating multiple connected digital inverter circuits 400 as digital driver circuits, only one half of each digital inverter circuit is active at a time. For instance, a first cascode circuit of a first digital inverter circuit may be active at the same time as a first cascode circuit of a second digital inverter circuit due to both first cascode circuits receiving the same input signal IN33. With both the first cascode circuit of a first digital driver circuit and the first cascode circuit of a second digital driver circuit active, the output electrode OUTPUT may be able to drive twice the load as a single, first cascode circuit. Similarly, a second cascode circuit of a first digital driver circuit may be active at the same time as a second cascode circuit of a second digital inverter circuit due to both cascode circuits receiving the same input signal IN18. With both the second cascode circuit of a first digital driver circuit and the second cascode circuit of a second digital driver circuit active, the output electrode OUTPUT may be able to drive twice the load as a single, second cascode circuit.

In some examples, any number of digital inverter/driver circuits 400 may be connected in series such that any number of first cascode circuits or second cascode circuits may be active at the same time to drive a desired load. In some examples, the number of first cascode circuits and/or the number of second cascode circuits that are active simultaneously is controlled by providing the input signals IN33 and IN18 to only the desired cascode circuits (e.g., a first cascode circuit of a first digital driver circuit and a first cascode circuit of a third digital driver circuit). In some examples, the number of first cascode circuits and/or the number of second cascode circuits that are active simultaneously is controlled by other signals (e.g., reference signals VREFP and/or VREFN).

In many of the above-described operations, the drain to source voltage across each of the transistors may change depending on the input signals IN33 and IN18 as well as on the output signal OUTPUT. In the example of FIG. 4, given a case where DATA I/O is in a logical high/on state (e.g., VDDIO) such that the first transistor 404 is inactive (because the input signal IN33 is high, e.g., approximately 3.3V as shown in FIG. 2C) and the fourth transistor 412 is active (because the input signal IN18 is high, e.g., approximately 1.8V as shown in FIG. 2C), the output electrode OUTPUT is pulled to a logical low/off state (e.g., VSSIO). With the OUTPUT in a logical low/off state, the third transistor 408 is inactive while the seventh transistor 440 is active. The seventh transistor 440, which is a p-type transistor, is active when the OUTPUT is in a logical low/off state because there is not sufficient voltage applied to its gate electrode to prevent current flow. Specifically, the drain electrode of the fifth transistor 414, which is connected to the gate electrode of the seventh transistor 440, is connected to the ground voltage (e.g., VSSIO) through the fifth transistor 414 and the fourth transistor 412 when the OUTPUT is in a low/off state.

With the seventh transistor 440 active when the OUTPUT is in a logical low/off state, a voltage at the source electrode of the seventh transistor 440 is raised by a threshold voltage of the seventh transistor 440. The threshold voltage may take many values, however, in examples such as the illustrated example of FIG. 4, the threshold voltage of the seventh transistor 440 ranges between 0.5V-1.0V. As the source electrode of the seventh transistor 440 is connected to a drain electrode of the second transistor 406, the drain voltage at the second transistor 406 is increased by approximately the threshold voltage of the seventh transistor 440. Because the voltage is higher at the drain electrode of the second transistor 406, the voltage across the second transistor 406 (e.g., drain to source voltage) is reduced. This effect continues with the first transistor 404 as the voltage at the drain electrode of the first transistor 404 is increased. Accordingly, the voltage across the first transistor 404 (e.g., drain to source voltage) is reduced. The reduction in the voltage across the first transistor 404 and the second transistor 406 ensures their drain to source voltages are lower than their tolerance voltages.

In the example of FIG. 4, given a case where DATA I/O is in a logical low/off state (e.g., VSSIO) such that the first transistor 404 is active (because the input signal IN33 is low, e.g., approximately 1.8V as shown in FIG. 2C) and the fourth transistor 412 is inactive (because input signal IN18 is low, e.g., 0V as shown in FIG. 2C), the output electrode OUTPUT is pulled to a logical high/on state (e.g., VDDIO). With the OUTPUT in a logical high/on state, the seventh transistor 440 is inactive while the eighth transistor 442 is active. The eighth transistor 442, which is an n-type transistor, is active as a voltage at its gate electrode is greater than a threshold voltage. Specifically, a voltage at the drain electrode of the second transistor 406 is connected to VDDIO through the second transistor 406 and the first transistor 404, and such voltage is applied to the gate electrode of the eighth transistor 442 when the OUTPUT is in a logical high/on state. Conversely, the seventh transistor 440, which is a p-type transistor, is inactive because its gate electrode is receiving sufficient voltage to prevent current flow. Specifically, the source electrode of the eighth transistor 442, which is connected to the gate electrode of the seventh transistor 440, is connected to VDDIO through the sixth transistor 416 to the output electrode OUTPUT. The output electrode OUTPUT is connected to VDDIO through the third transistor 408, the second transistor 406, and the first transistor 404, all of which are active. Accordingly, a voltage at a source electrode and at a drain electrode of each of the first transistor 104, the second transistor 106, and the third transistor will be approximately VDDIO. The drain to source voltage across each of the transistors will thus be approximately 0V.

Continuing with the example of FIG. 4 when the OUTPUT is in a logical high/on state, a voltage at the source electrode of the eighth transistor 442 is reduced by a threshold voltage of the eighth transistor 442. The threshold voltage may take many values, however, in examples such as the illustrated example of FIG. 4, the threshold voltage of the eighth transistor 442 ranges between 0.5V-1.0V. As the source electrode of the eighth transistor 442 is connected to a drain electrode of the fifth transistor 414, the drain voltage at the eighth transistor is reduced by approximately the threshold voltage of the eighth transistor 442. Because the voltage is lower at the drain electrode of the fifth transistor 414, the voltage across the fifth transistor 414 (e.g., drain to source voltage) is reduced. This effect continues with the fourth transistor 412 as the voltage at the drain electrode of the fourth transistor 412 is reduced. Accordingly, the voltage across the fourth transistor 412 (e.g., drain to source voltage) is reduced. The reduction in the voltage across the fourth transistor 412 and the fifth transistor 414 ensures their drain to source voltages are lower than their tolerance voltages.

In the example of FIG. 4, again given the first transistor 404 is inactive and the fourth transistor 412 is active, the output electrode OUTPUT is pulled to a logical low/off state (e.g., VSSIO). With the OUTPUT in a logical low/off state, the eighth transistor 442 is inactive while the seventh transistor 440 is active. The seventh transistor 440, which is a p-type transistor, is active because its gate electrode no longer receives sufficient voltage to prevent current flow. Specifically, the source electrode of the eighth transistor 442, which is connected to the gate electrode of the seventh transistor 440, is connected to VSSIO through the sixth transistor 416 and the fifth transistor 414. Further, as the fourth transistor 412, the fifth transistor 414, and the sixth transistor 416 are all active, a voltage at a source electrode and at a drain electrode of each of the fourth transistor 412, the fifth transistor 414, and the sixth transistor 416 will be approximately VSSIO. The drain to source voltage across each of the transistors will thus be approximately 0V.

Figure 5:
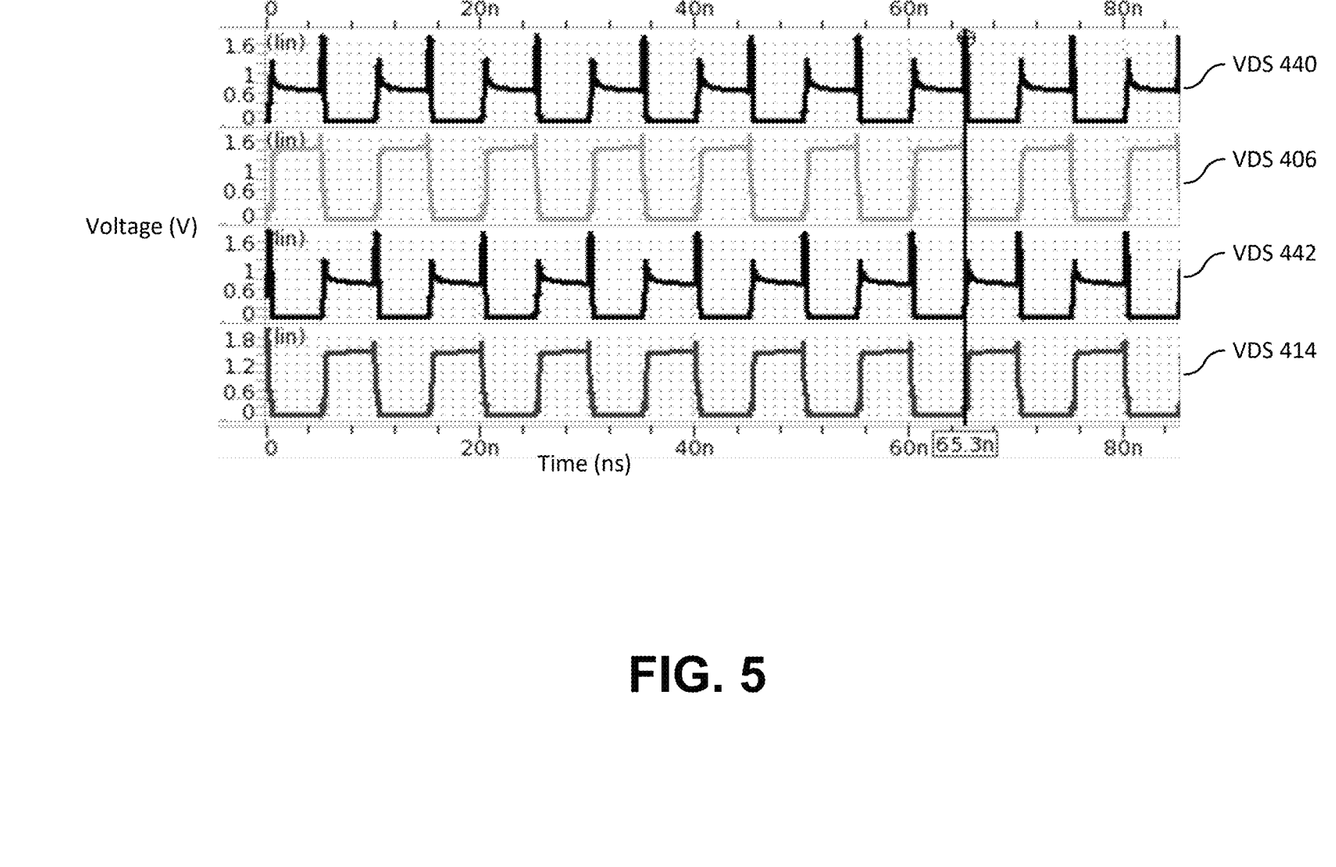
FIG. 5 illustrates example voltage waveforms taken at different points within the example digital inverter circuit of FIG. 4.

Now referencing FIG. 5, FIG. 5 illustrates example voltage waveforms taken at different points within the example digital inverter circuit of FIG. 4. In similarity with FIG. 3, in FIG. 5, the waveforms are generated with a periodic input signal (e.g., DATA I/O of FIG. 2A/B/C) that varies between a logical high and a logical low. The topmost waveform represents a drain to source voltage (VDS) across the seventh transistor 440, the next lower waveform represents a drain to source voltage across the second transistor 406, the next lower waveform represents a drain to source voltage across the eighth transistor 442, and the lowermost waveform represents a drain to source voltage across the fifth transistor 414. As illustrated by the waveforms, the drain to source voltages change between two states with one state being at approximately 0V and another state being at a higher voltage. The higher voltage, though, is less than a tolerance voltage for each of the respective transistors. The two states correspond to the various transistors' reaction to a periodic input signal. Each of the waveforms is approximately the same when compared to the waveforms of FIG. 3 with the waveform of the seventh transistor 440 corresponding to the waveform of the first diode 110 and the waveform of the eighth transistor 442 corresponding to the waveform of the second diode 118. While the waveforms have transient voltages between states, the transient voltages remain below the tolerance voltages for each of the transistors.

In some examples, it may be advantageous to use the logic circuit of FIG. 4 over the logic circuit of FIG. 1. For instance, the output electrode of FIG. 1 is connected to the gate electrode of the first diode 110 and the second diode 118. This may cause issues if the example of FIG. 1 is used in a driver circuit. For instance, the output electrode of the digital inverter circuit of FIG. 1 may be exposed to electrostatic discharge. The electrostatic discharge may then feedback to the gate electrodes of the first diode 110 and the second diode 118 and may cause undesired behavior of, or damage to, the first diode 110 and the second diode 118.

While the transistors illustrated in FIG. 1 and FIG. 4 are MOSFET transistors, a person having ordinary skill in the art will understand other transistors (e.g., BJTs, IGBTs, other FETs) may be used. Further, while enhancement type transistors are used in the circuits of FIG. 1 and FIG. 4, depletion type transistors may also be used in addition to or in lieu of enhancement type transistors.

As described elsewhere herein, an example digital inverter circuit may include two cascode circuits connected in series and an output electrode. Each of the cascode circuits may include three transistors connected in series and a diode connected in parallel with one of the three transistors. The diode in each of the cascode circuits, as well as the overall configuration of the circuits, may help prevent a voltage across any one of the transistors (e.g., a drain to source voltage) in the digital logic circuit from reaching damaging levels, such as a break-down voltage. Alternatively, instead of using a diode connected in parallel with one of the three transistors, an example digital inverter circuit may include adding a transistor to each of the cascode circuits. The additional pair of transistors may be connected to each other and due to their configuration, may also help to prevent a voltage across any one of the transistors (e.g., a drain to source voltage) in the digital logic circuit from reaching damaging levels, such as a break-down voltage. The example digital inverter circuits described herein also do not require additional, dynamic signals and are relatively simple to implement.

A computer-readable design of an inverter circuit (or driver circuit) according to the present disclosure may be included within a library of available pre-designed cells or circuit blocks or circuit portions stored on a computer-readable medium (e.g., in a digital representation of an inverter circuit or a driver circuit). This allows the design of an inverter circuit (or driver circuit) according to the present disclosure to be placed as a circuit block within a design of an integrated circuit (e.g., a digital representation of the integrated circuit). For example, an inverter circuit (or driver circuit) specified by the computer-readable design may be incorporated into the design of a processor circuit.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element may be depicted in the figures and like elements are labeled with like numerals. The disclosure and drawings are, accordingly, to be regarded in an illustrative sense rather than a restrictive sense.

What is claimed is:

1. A logic circuit comprising:
   a first cascode circuit comprising:
      a first transistor, a second transistor, and a third transistor connected in series, the third transistor connected to an output of the first cascode circuit; and
      a first diode connected in parallel with the third transistor; and
   a second cascode circuit comprising:
      a fourth transistor, a fifth transistor, and a sixth transistor connected in series, the sixth transistor connected to an output of the second cascode circuit; and
      a second diode connected in parallel with the sixth transistor,
   wherein the output of the first cascode circuit is connected to the output of the second cascode circuit and connects the first cascode circuit in series with the second cascode circuit.

2. The logic circuit of claim 1, wherein the first diode comprises a first diode-connected transistor and the second diode comprises a second diode-connected transistor.

3. The logic circuit of claim 2,
   wherein the first diode comprises a diode-connected positive metal oxide semiconductor (PMOS) device, a gate of the PMOS device being connected to a drain of the PMOS device and connected to the output of the first cascode circuit; and
   wherein the second diode comprises a diode-connected negative metal oxide semiconductor (NMOS) device, a gate of the NMOS device being connected to a drain of the NMOS device and to the output of the second cascode circuit.

4. The logic circuit of claim 1,
   wherein the first transistor, the second transistor, and the third transistor are PMOS transistors; and
   wherein the fourth transistor, the fifth transistor, and the sixth transistor are NMOS transistors.

5. The logic circuit of claim 1,
wherein a gate electrode of the second transistor and a gate electrode of the third transistor are connected to a first bias voltage;
wherein a gate electrode of the fifth transistor and a gate electrode of the sixth transistor are connected to a second bias voltage; and
wherein the first bias voltage and the second bias voltage are dependent on a voltage mode and a first supply voltage.

6. The logic circuit of claim 5, wherein the second bias voltage is greater than the first bias voltage.

7. The logic circuit of claim 5, further comprising:
a first input generating circuit connected to the gate electrode of the first transistor and configured to output a first input signal that tracks a data signal ranging between the first bias voltage and the first supply voltage; and
a second input generating circuit connected to the gate electrode of the fourth transistor and configured to output a second input signal that tracks a data signal ranging between the second bias voltage and a second supply voltage.

8. The logic circuit of claim 1,
wherein the first diode is configured to limit a maximum drain to source voltage across the third transistor to less than a tolerance voltage of the third transistor; and
wherein the second diode is configured to limit a maximum drain to source voltage across the sixth transistor to less than a tolerance voltage of the sixth transistor.

* * * * *